United States Patent
Xing et al.

(10) Patent No.: US 9,362,389 B2
(45) Date of Patent: Jun. 7, 2016

(54) POLARIZATION INDUCED DOPED TRANSISTOR

(71) Applicant: University of Notre Dame du Lac, Notre Dame (IN)

(72) Inventors: Huili (Grace) Xing, Notre Dame, IN (US); Debdeep Jena, Notre Dame, IN (US); Kazuki Nomoto, Notre Dame, IN (US); Bo Song, Notre Dame, IN (US); Mingda Zhu, Notre Dame, IN (US); Zongyang Hu, Notre Dame, IN (US)

(73) Assignee: University of Notre Dame du Lac, Notre Dame, IN (US)

( * ) Notice: Subject to any disclaimer, the term of this patent is extended or adjusted under 35 U.S.C. 154(b) by 0 days.

(21) Appl. No.: 14/470,569

(22) Filed: Aug. 27, 2014

(65) Prior Publication Data

US 2015/0060876 A1    Mar. 5, 2015

Related U.S. Application Data

(60) Provisional application No. 61/870,495, filed on Aug. 27, 2013.

(51) Int. Cl.

| | |
|---|---|
| *H01L 29/778* | (2006.01) |
| *H01L 29/20* | (2006.01) |
| *H01L 29/201* | (2006.01) |
| *H01L 29/205* | (2006.01) |
| *H01L 29/06* | (2006.01) |
| *H01L 29/10* | (2006.01) |
| *H01L 29/808* | (2006.01) |

(52) U.S. Cl.
CPC ........ *H01L 29/7787* (2013.01); *H01L 29/0619* (2013.01); *H01L 29/1095* (2013.01); *H01L 29/201* (2013.01); *H01L 29/2003* (2013.01); *H01L 29/205* (2013.01); *H01L 29/8083* (2013.01)

(58) Field of Classification Search
CPC ............ H01L 29/7787; H01L 29/2033; H01L 29/201; H01L 29/205; H01L 29/0619; H01L 29/0611; H01L 29/1095; H01L 29/8083
See application file for complete search history.

(56) References Cited

U.S. PATENT DOCUMENTS

| | | | |
|---|---|---|---|
| 2005/0208686 A1* | 9/2005 | Ryu et al. ................ | 438/21 |
| 2006/0231860 A1* | 10/2006 | Mishra ................ | H01L 29/1029 257/192 |
| 2008/0173876 A1* | 7/2008 | Ueno ................ | H01L 29/66068 257/77 |
| 2011/0204381 A1* | 8/2011 | Okada et al. ................ | 257/76 |
| 2013/0126885 A1* | 5/2013 | Disney et al. ................ | 257/76 |

FOREIGN PATENT DOCUMENTS

| | | | | |
|---|---|---|---|---|
| CN | 103035706 | * | 4/2013 | ............ H01L 29/778 |
| CN | 103035706 A | * | 4/2013 | ............ H01L 29/778 |
| CN | 1030335706 A | * | 4/2013 | ............ H01L 29/778 |

* cited by examiner

*Primary Examiner* — Yasser A Abdelaziez
*Assistant Examiner* — Farun Lu
(74) *Attorney, Agent, or Firm* — Greenberg Traurig, LLP

(57) ABSTRACT

A nitride-based field effect transistor (FET) comprises a compositionally graded and polarization induced doped p-layer underlying at least one gate contact and a compositionally graded and doped n-channel underlying a source contact. The n-channel is converted from the p-layer to the n-channel by ion implantation, a buffer underlies the doped p-layer and the n-channel, and a drain underlies the buffer.

21 Claims, 19 Drawing Sheets

4. Gate dielectric and gate metallization

| Sample | $p_0(cm^3)$ | $\mu(cm^2/V\,s)$ | $N_A-N_D(cm^{-3})$ |
|---|---|---|---|
| A | $1.7\times10^{17}$ | 25 | $1.5\times10^{18}$ |
| B | $2.7\times10^{17}$ | 20 | $2.3\times10^{18}$ |
| C | $5.3\times10^{17}$ | 13 | $4.1\times10^{18}$ |
| D | $6.1\times10^{17}$ | 5.8 | $9.1\times10^{18}$ |

(Sample #1)
After implanting Si in GaN:Mg
N-type was obtained
$R_s = 872 \, \Omega/\text{sq.}$
$L_t = 0.55 \, \mu m$
$P_c = 2.64 \times 10^6 \, \Omega \cdot cm^2$ (Sample #1)
After implanting Si in GaN:Mg
N-type was obtained
$R_s = 1872 \, \Omega/\text{sq.}$
$L_t = 0.60 \, \mu m$
$P_c = 6.75 \times 10^5 \, \Omega \cdot cm^2$ 1. Epitaxial structure 2. Si ion implantation (i/i) and activation 3. MBE regrowth of p+GaN & ohmic contacts 4. Gate dielectric and gate metallization

POLARIZATION INDUCED DOPED TRANSISTOR

CROSS REFERENCE TO RELATED APPLICATION

This application is a non-provisional application claiming priority from U.S. Provisional Application Ser. No. 61/870,495, filed Aug. 27, 2013, entitled "Integrated Vertical Power Transistor Device" and incorporated herein by reference in its entirety.

GOVERNMENT LICENSE RIGHTS

This invention was made with government support under DE-AR0000454 awarded by The U.S. Department of Energy. The government has certain rights in the invention.

FIELD OF THE DISCLOSURE

The present description relates generally to field-effect transistors (FETs) and more particularly to a polarization doped transistor.

BACKGROUND OF RELATED ART

Wide bandgap semiconductors (WBG) offer the a compelling solution for power electronics owing to their large breakdown electric field ($E_b$) and high carrier mobilities. The Baliga's figure of merit ($\epsilon \mu E_b^3$) of WBGs including gallium nitride (GaN) and silicon carbide (SiC) is approximately one hundred (100) times higher than that of silicon (Si), and the figure of merit for WBGs with wider bandgap such as aluminum nitride (AlN) and diamond is even higher. WBG power electronic devices promise miniaturized power supplies and agile electricity conditioning systems with higher efficiency than the present technologies based on Si. Furthermore, they promise operations under high temperatures and harsh environments such as near a car engine and a myriad of applications which cannot yet be foreseen today. Even though this fact has been known for several decades, the development of WBG power electronics has been long limited by two intrinsic difficulties: 1) Lack of large size crystalline substrates with low defect densities and 2) efficient doping of both n- and p-types.

The recent development of unipolar devices on WBG with relatively low crystal quality has been notable, with GaN-onSi high-electron-mobility transistor (HEMT) based lateral power switches being a prime example. However, for higher voltage and power applications, other devices, such as for example, vertical power devices are necessary, demanding high crystal quality and both n- and p-type doping. SiC as an indirect semiconductor enjoys conduction modulation to reduce on resistance ($R_{on}$) and due to the same very reason, the SiC power switches are slow. Also, substrates of large size (e.g., greater than approximately four inches) and low defect densities (e.g., less than approximately $10^2$ cm$^{-2}$) are available for SiC. On the contrary, heterostructures are more readily available in GaN. Combined with higher carrier mobility in GaN, higher output currents and, more importantly, higher efficiencies and higher frequency operation are expected.

The advent of high quality GaN substrates (e.g., threaded dislocation densities (TDDs) of approximately $10^4$ cm$^{-2}$) generally enables vertical GaN high power devices. But it does not solve the two intrinsic problems of GaN vertical switches compared to Si: a) inferior inversion channels, which is also an ongoing challenge for SiC, and b) poor p-type conductivity for both GaN and SiC, but no p-GaN is demonstrated yet by ion implantation.

BRIEF DESCRIPTION OF THE DRAWINGS

FIGS. 3A-3F together illustrate an example operation principal of the example PolarJFET of FIG. 1.

DETAILED DESCRIPTION

The following description of example methods and apparatus is not intended to limit the scope of the description to the precise form or forms detailed herein. Instead the following description is intended to be illustrative so that others may follow its teachings.

Realizing the opportunity and the problem with the prior approaches, the present disclosure includes a plurality of novel power devices, including for instance, a PolarJFET, a PolarMOS which builds on the PolarJFET, and a PolarMOSH. In one example, a PolarJFET disclosed herein utilizes polarization-induced doping to obtain high conductivity p-type layers and ion implantation to convert p-GaN to n-GaN. The example PolarJFET makes use of the entire bandgap barrier of GaN at 3.4 eV by using a p-n junction for low leakage, normally off operation, high breakdown voltage and efficient gate-drive, and high mobility channel electrons for record high $V_B R_{on}$. The material cost may be reduced by employing epitaxial lift-off in conjunction with GaN substrates (thus effectively re-using the substrates) and by the intrinsically smaller device size (than Si). The example novel PolarJFETs described herein employ a simple process flow and fabrication technologies that are compatible with Si processes. With a substantial reduction in both material and fabrication costs, the disclosed devices provide a path for a lower functional cost than Si.

In one example, the present disclosure includes a vertical power transistor based on GaN employing 1) polarization-doping to achieve dispersion free p-type layers providing device performance improvement, 2) standard n-type ion implantation to fabricate the transistor channel providing fabrication cost reduction, and 3) epitaxial liftoff to re-use GaN substrates providing material cost reduction.

PolarJFET

Figure 1:
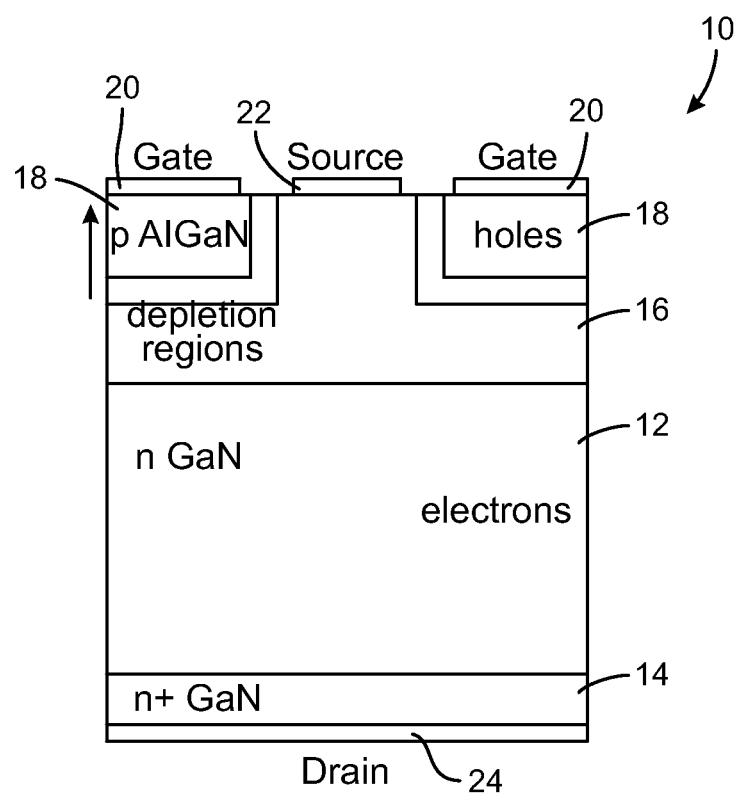
FIG. 1 is a cross-sectional view of an example vertical PolarJFET constructed in accordance with the teachings of the present invention.

Referring now to FIG. 1, an example of a vertical PolarJFET 10 is illustrated. As shown in FIG. 1, a drift layer such as a doped n layer 12 of gallium nitride (GaN) is provided on an n+layer 14 on a substrate, which in this example, is also GaN. A depletion region such as an n-channel 16 region is provided on the n layer 12 and is generally located laterally between two p-type regions 18. One or more gate contacts 20 are provided on the p-type regions 18 and one or more source contacts 22 and one or more drain contacts 24 at also provided. Each of the contacts 20, 22, 24 may be any suitable material for forming an electrical contact as is known in the art. It will be appreciated by one of ordinary skill in the art that the example vertical PolarJFET 10 may be constructed in any suitable manner, including for instance as a horizontal device as desired. Furthermore, it will be appreciated that the example devices disclosed herein may be constructed of any number of suitable terminals, e.g., two, three, four, etc. as desired.

The example top p-layer 18 is grown by polarization induced p-doping in a suitable material, such as for instance, aluminum gallium nitride (AlGaN). In this instance, polarization doping presents a fundamentally different design paradigm from the conventional p-GaN doped with magnesium (Mg) (as detailed herein below). Furthermore, the n-type region 16 laterally sandwiched between the p-type regions 18 is realized by a low cost ion implantation of silicon (Si). The fabrication process is considerably simplified by avoiding multiple epitaxial regrowths that are typically utilized in WBG vertical transistors. A voltage controlled vertical power transistor is preferred for its high speed and low power consumption.

In the present disclosure the example p-layer 18 is started by polarization-induced doping, which means very low or no Mg is present in this p-layer and the effective polarization acceptor concentration is equal to that of holes ($N_{A,pi}$=p). In comparison, for Mg doped GaN, about 100× more Mg acceptors are needed to produce the same number of holes due to its deep energy level. Implanting Si into the polarization doped p-region causes higher electron mobility due to the absence of ionized Mg. This high mobility as well as the foundry friendly process to realize PolarJFETs provides a path to a lower functional cost in WBGs vertical power devices than Si.

Figure 2A:
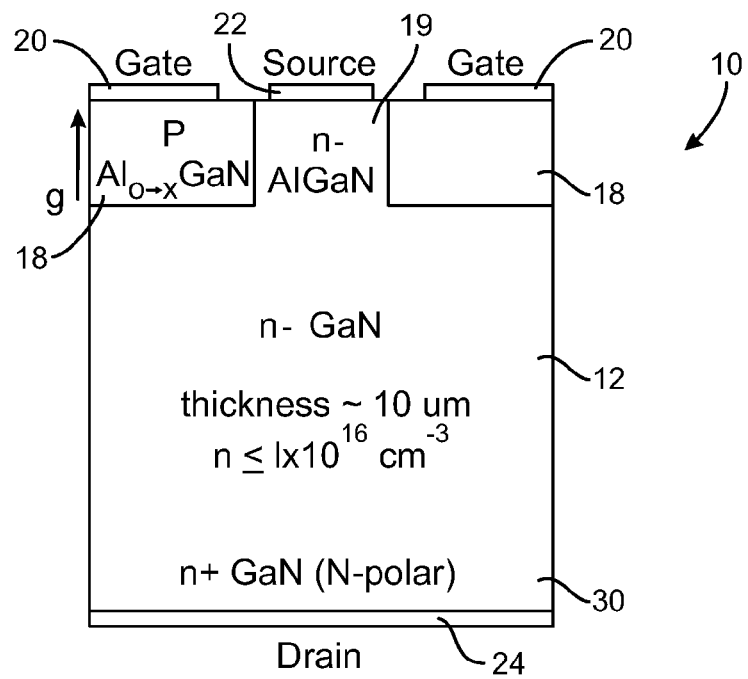
FIG. 2A is another cross-sectional view of an example vertical PolarJFET.
Figure 2B:
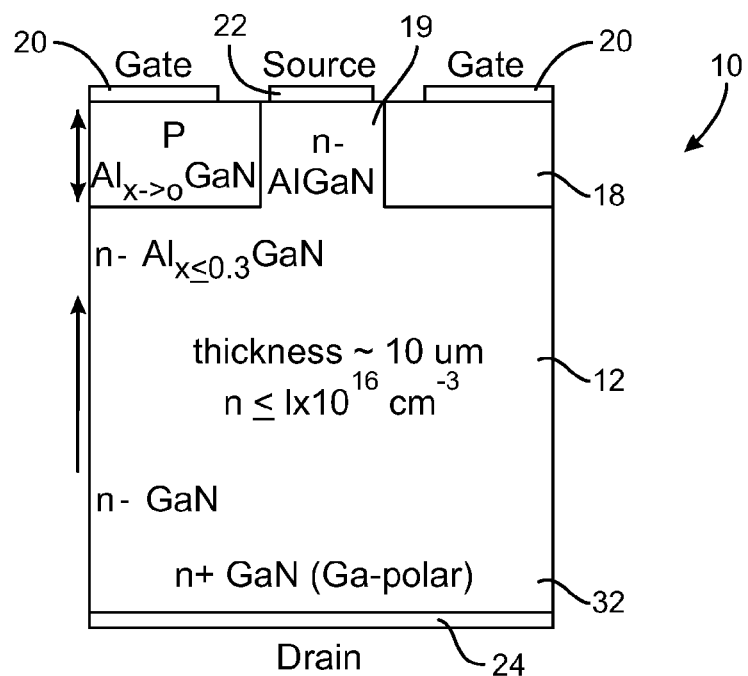
FIG. 2B is another cross-sectional view of an example vertical PolarJFET.

Referring to FIGS. 2A and 2B, there are illustrated two epitaxial designs of the PolarJFET 10. FIG. 2A illustrates the PolarJFET 10 on a N-face GaN substrate 30, while FIG. 2B illustrates the PolarJFET 10 on a Ga-face GaN substrate 32. In each of FIGS. 2A and 2B, the top layer 18 is a polarization-induced p-type Al$_x$GaN ($N_{A,pi}$=p approximately 5e17 cm$^{-3}$) layer and the bottom layer 12 is a lightly doped n-GaN layer doped either by impurity or polarization-induced n-type (n approximately 1e16 cm$^{-2}$). A middle region 19 of the top p-layer layer can be converted into an n-type layer by ion implantation. Thus the middle region can form a lateral p-n junction to gate the PolarJFET 10. The converted middle region 19 typically has a net donor concentration of approximately 1e16 cm$^{-3}$ in order to balance the normally off operation and the maximum output current. Ion implantation of Si into GaN enables the achievement of a functional cost of GaN power devices in comparison to Si.

As a result, ion implantation simplifies the realization of the example PolarJFET 10, including epitaxial growth of the entire device layer structure followed by an extremely simple fabrication flow.

As a result, only implantation, activation, metallization and junction extension are needed. This fabrication technique can reduce the device cost substantially when compared to previous devices.

FIGS. 3A-3H together illustrate the operation principle of the example PolarJFET 10, which in this example is a vertical JFET in GaN enabled by polarization induced doping. As illustrated in FIG. 3A, at zero gate bias, the n-channel (i.e. the depletion region 16) is fully depleted and the ionized positive charges in the n-channel are fully balanced by the negative charges in the p-gate 18. Laterally this is a reduced surface field (RESURF) effect when the vertical electric field develops to support a high voltage between the drain 24 and the source 22.

As illustrated in FIGS. 3B-3D, increasing the voltage at the drain 24, while keeping the voltage at the gates 18 ($V_{gs}$) at 0 V will increase the depletion region 16 of the p-n junction as well as the region right below the n-channel. The electric field along the n-channel is actually lower than that at the p-n junction due to the aforementioned RESURF effect. With a low enough donor concentration (e.g., less than approximately 1e16 cm$^{-3}$) and a large enough thickness (e.g., approximately greater than 8 μm) of the n-drift region 12, this p-n junction can sustain higher than 1000 V with a leakage current lower than 10-5 A/cm$^2$.

As illustrated in FIGS. 3E-3F, when a positive voltage ($V_{gs}$) is applied to the gates 18, the depletion region 16 in the lateral p-n junction shrinks, thus allowing current to flow vertically from the source 22 to the drain 24. The resistance associated with this on-state is determined by the resistance of the n-channel, the resistance of the drift layer as well as the top and bottom contact resistances as is known in the art.

Accordingly, in one example, assuming an electron concentration of 1e16 cm$^{-3}$ everywhere and an electron mobility of 400 cm$^2$/Vs in the 500 nm thick channel and 1000 cm$^2$/Vs in the 10 μm thick drift region, the estimated $R_{on}$ is about 0.4 mohm-cm$^2$ at small current levels with about 0.3 mohm-cm$^2$ from the n-GaN drift layer. Because the contact specific resistance to n+GaN is typically better than 10-6 ohm-cm², the contribution of the contact resistance is negligibly small. For free standing GaN substrates, a resistivity of 0.01 ohm-cm is routinely reported; assuming a substrate thickness of 400 μm, the substrate-induced resistance is 0.4 mΩ/cm².

In the present example, a bandgap selective etch (described in detail hereinbelow) may be used to lift off the top active device epitaxial layers from the GaN substrate, which may allow for the substrate-induced resistance to also be neglected. While it is helpful to evaluate the minimal $R_{on}$ in the limit of low current densities, $R_{on}$ at high current levels is the practical value for power devices employed in real applications. In this case, it is preferable to have the highest electron mobility in the channel as possible to achieve low $R_{on}$ at high current levels. This is because in a FET the drain current gradually saturates with increasing $V_{ds}$, (i.e. increasing $R_{on}$) such that the channel resistance constitutes a larger portion of the total $R_{on}$.

Figure 4A:
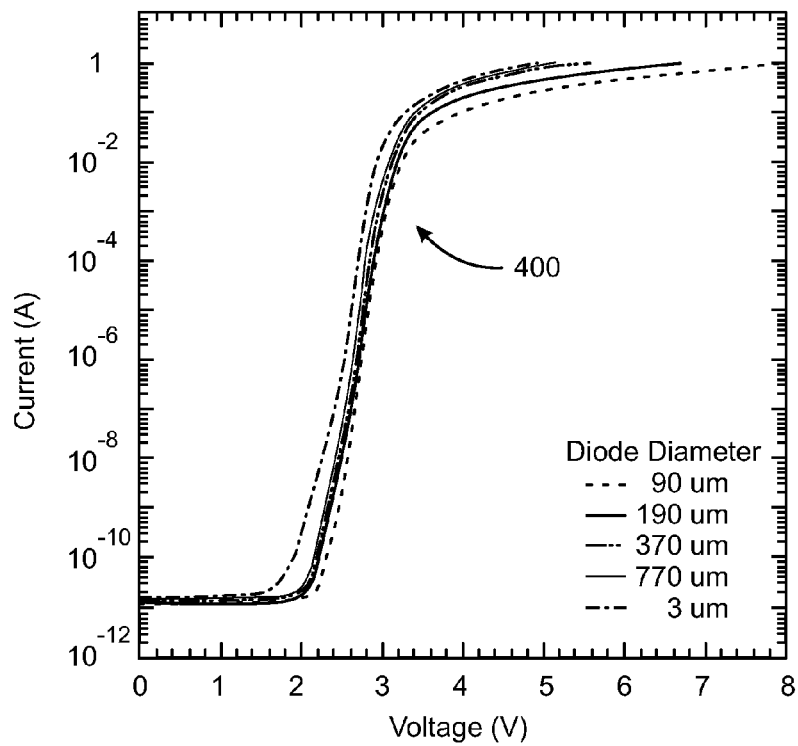
FIG. 4A illustrates a voltage versus current plot showing the forward I-V characteristics of various GaN p-n junction diodes.
Figure 4B:
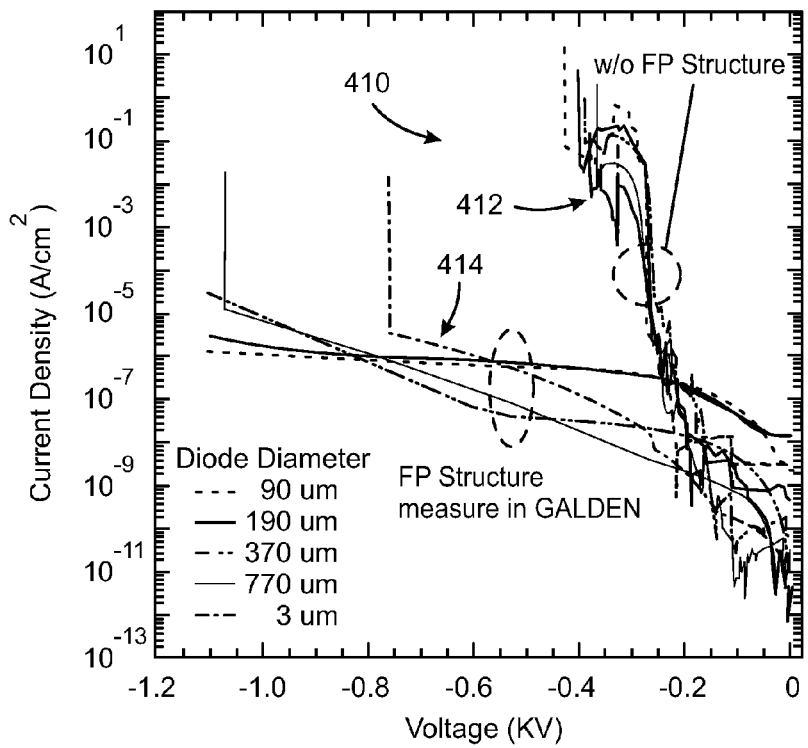
FIG. 4B illustrates a voltage versus current density plot showing the reverse I-V characteristics of a various p-n junctions.
Figure 4C:
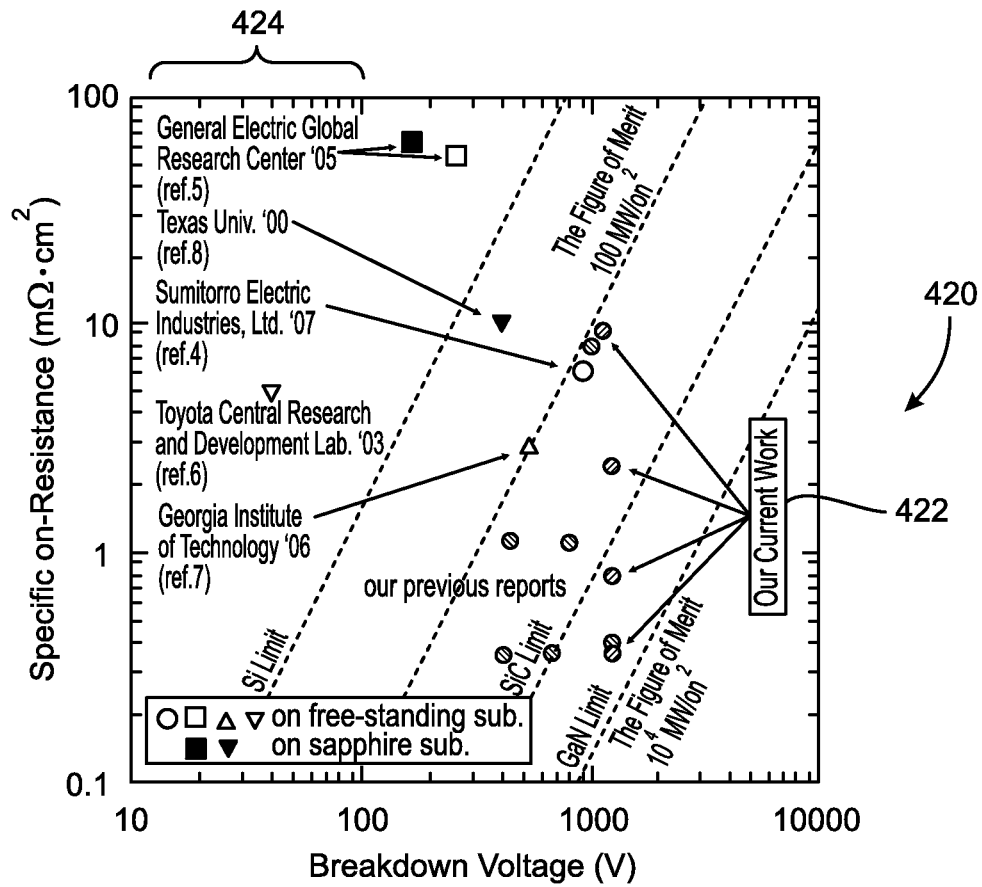
FIG. 4C illustrates a plot of a breakdown voltage versus an on-resistance.

For reference, FIG. 4A illustrates a voltage (V) versus current (A) plot 400 showing the forward I-V characteristics of various GaN p-n junction diodes. FIG. 4B illustrates a voltage (kV) versus current density (A/cm²) plot 410 showing the reverse I-V characteristics of a various p-n junctions without a field plate structure 412 and with a field plate structure 414 on free-standing GaN substrates. FIG. 4C illustrates a plot 420 of a breakdown voltage (V) versus an on-resistance (mΩ/cm²) for an example fabricated GaN p-n and p-i-n junction diodes manufactured in accordance with at least some of the teachings of the present disclosure 422 and in accordance with previously reported work 424. The plot 420 demonstrates a high $V_{br}$ and a low $R_{on}$ for the present work 422, which is particularly close to the GaN theoretical limit.

As previously noted, polarization-induced doping is instrumental in realizing the vertical PolarJFET 10 disclosed herein. First, it is important to note that the high spontaneous and piezoelectric polarization fields of GaN are generally absent in Si and SiC. This unique feature is also one of the enablers of the example PolarJFET 10.

As known to one of ordinary skill in the art, on the Ga-face GaN, when grading from the GaN layer to the AlGaN layer, the difference in spontaneous and piezoelectric polarization charges in $Al_xGaN$ to $Al_{x+\delta}GaN$ leads to a 3 dimensionally distributed positive charge in the crystal layer. These positive charges associated with the crystal lattice are immobile, in turn attracting mobile negative charge to minimize the electric field within the crystal layer. This polarization-induced electron doping phenomenon is different from conventional impurity induced doping in that the polarization-induced electrons (or holes) are electric field ionized but the impurity-doped electrons (holes) result from thermal excitation of electrons (holes) at the donor (acceptor) energy states to the conduction (valence) energy band of the semiconductor. As a result, the polarization-induced electrons do not suffer from carrier freeze-out as the impurity-doped electrons do when the temperature decreases. Because the donor impurities Si and Ge have relatively small ionization energies in GaN, of approximately 25 meV, there is a relatively small difference at low carrier concentrations at room temperature between the two types of doping schemes. But at high carrier concentrations (e.g., greater than 1e17 cm⁻³), the polarization-doped electrons typically exhibit higher mobilities due to the absence of ionized impurity scattering.

N-type doping in GaN has been proven effective using impurities or polarization charges during epitaxial growth as well as dopant ion implantation. However, the difficulty in realizing an effective vertical GaN device is the p-type doping in GaN. Mg is the shallowest acceptor in GaN but its activation energy is still high at 170 meV approximately 7 kT(300K). This means that Mg doped GaN suffers from hole freeze-out even at room temperature, and GaN must be doped with a Mg concentration as high as 1e19 cm⁻³ in order to achieve a hole concentration of approximately 2e17 cm⁻³. Severe impurity scattering (charged and neutral) and the heavy effective mass of holes in GaN lead to a hole mobility typically on the order of 10-20 cm2/Vs. Furthermore, ohmic contacts on GaN:Mg have always been challenging, especially when making ohmic contacts to a buried p-GaN layer. To reduce the gate (p-region) resistance, it is necessary to introduce a reasonably high hole concentration. For example, assuming a hole concentration of 2e17 cm⁻³, Mg concentration of 1e19 cm⁻³ is used. In order to achieve 1e16 cm⁻³ net electron concentration by employing Si ion implantation, one needs to implant and activate precisely 1e19+1e16 cm⁻³ amount of Si (NSi−NMg=1e16 cm⁻³). Not only this is a daunting task itself, but also it severely degrades the electron mobility in this converted region due to the presence of an extremely high concentration of ionized impurities (approximately 2e19 cm−3). This results in very low mobilities of channel electrons.

Figure 5:
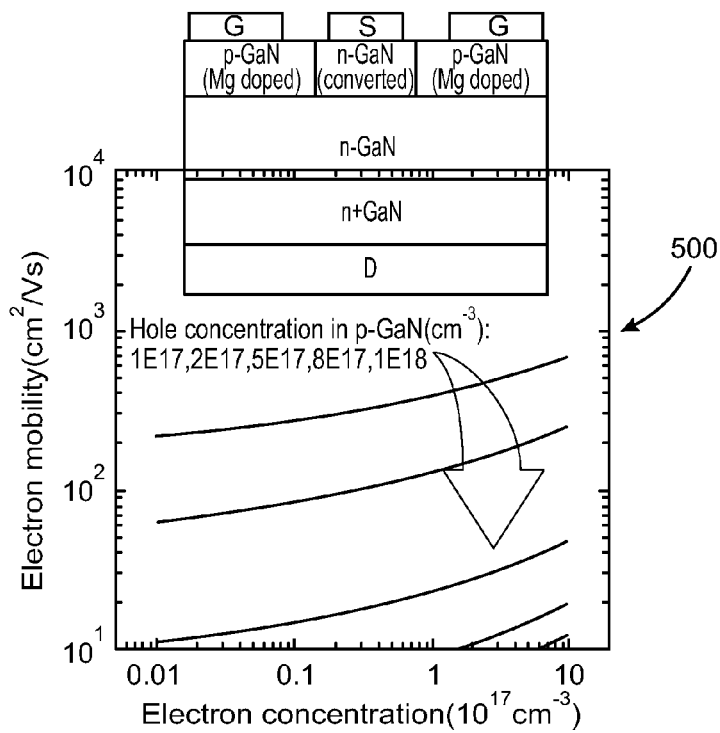
FIG. 5 illustrates a plot of an electron concentration versus electron mobility in a converted channel by ion implantation in GaN:Mg.
Figure 6:
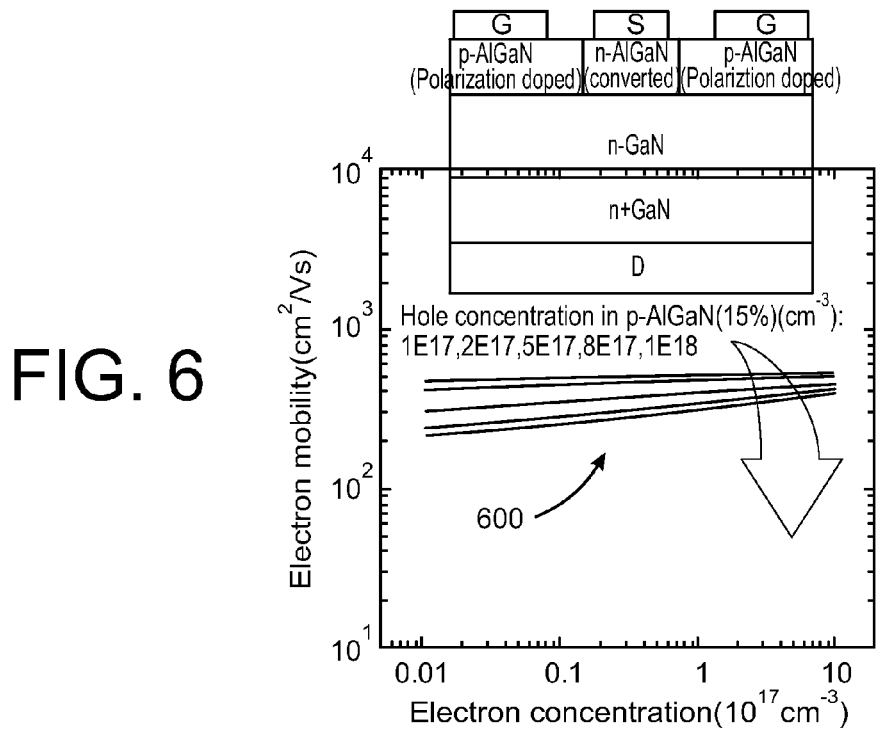
FIG. 6 illustrates a plot of an electron concentration versus electron mobility in a converted channel by ion implantation in polarization-doped p-type by grading the AL composition in ALGaN.

Because, in the present disclosure, the example PolarJFET 10 employs polarization doping, the hole concentration is equal to the "acceptor" concentration. In one example method, to convert a polarization-doped p-layer with a concentration of 1e17 cm⁻³ to n-type with an electron concentration of 1e16 cm⁻³, an implantation of Si at a concentration of only 1.1e17 cm⁻³ may be used. This implantation is feasible and leads to high channel electron mobility. As illustrated in FIGS. 5 and 6, a comparison between these two cases and the contrast is shown.

For instance, FIG. 5 illustrates a plot 500 of an electron concentration ($10^{17}$ cm⁻³) versus electron mobility (cm²/Vs) in a converted channel by ion implantation in GaN:Mg, while FIG. 6 illustrates a plot 600 of an electron concentration ($10^{17}$ cm⁻³) versus electron mobility (cm²/Vs) in polarization-doped p-type by grading the AL composition in ALGaN.

For very low hole concentrations, the mobility difference is small between GaN:Mg and polarization p-doping because the alloy scattering in polarization-doped layers dominate the mobility. But for the concentrations of interests to realize the example JFET 10 using ion implantation, polarization doped p-layer is preferred. For instance, if one designs the p-gate layer 18 to have a hole concentration of 2e17 cm⁻³, after converting to n-type by Si implantation, the electron mobility is around 100 cm²/Vs at 1e16 cm⁻³. For the polarization-doped hole concentration of 2e17 cm⁻³, the electrons in the converted n-layer exhibit a mobility as high as 400 cm²/Vs. In this example four times (4×) higher mobility translates to at least four times (4×) lower $R_{on}$.

Figure 7A:
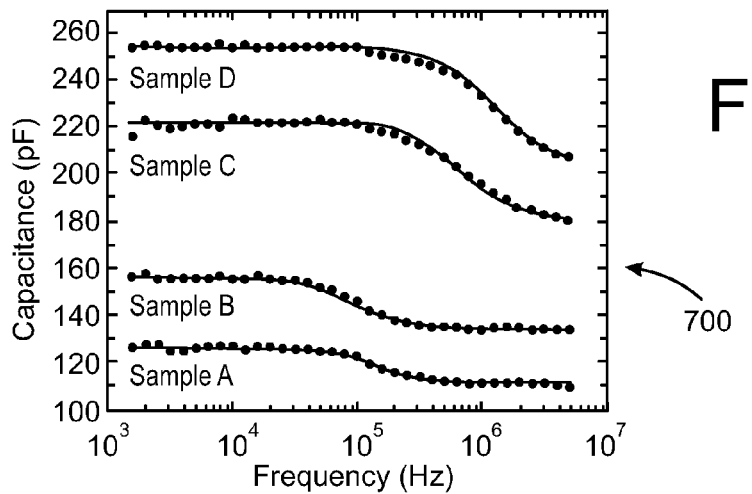
FIG. 7A illustrates a plot of a frequency versus capacitance for a zero-bias capacitance on various GaN p-n junctions.
Figure 7B:
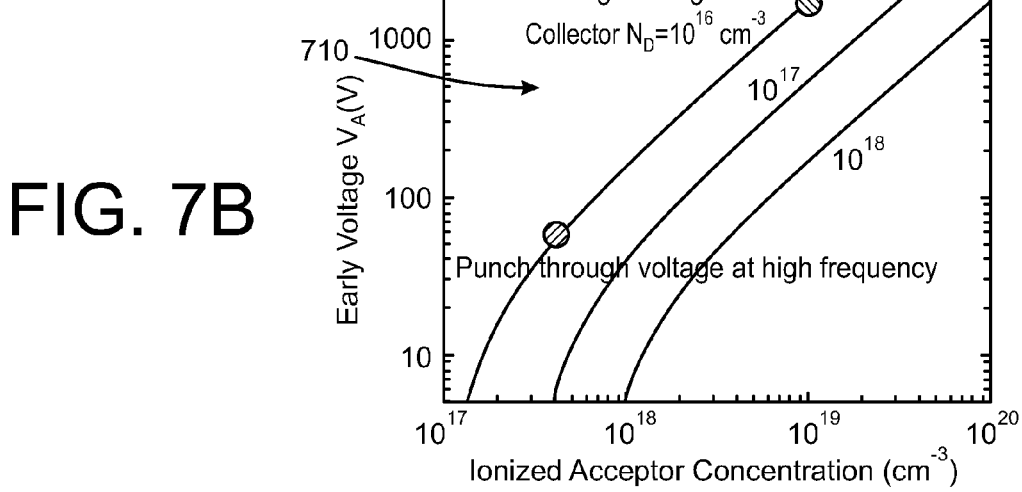
FIG. 7B illustrates a plot of an ionized acceptor concentration versus an early voltage within the depleted potion of the base.
Figure 8A:
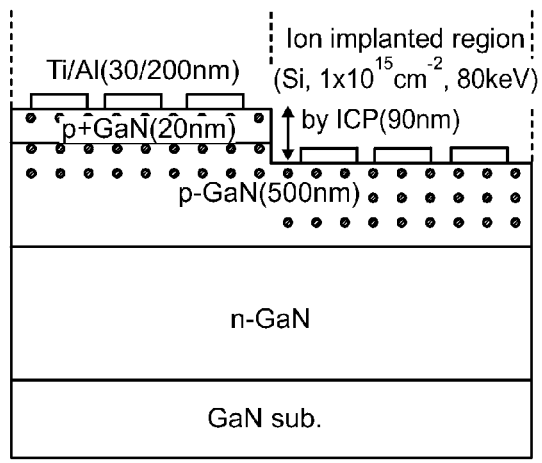
FIGS. 8A-8D together illustrate an example conversion of a p-GaN layer into n-GaN by ion implantation.
Figure 8B:
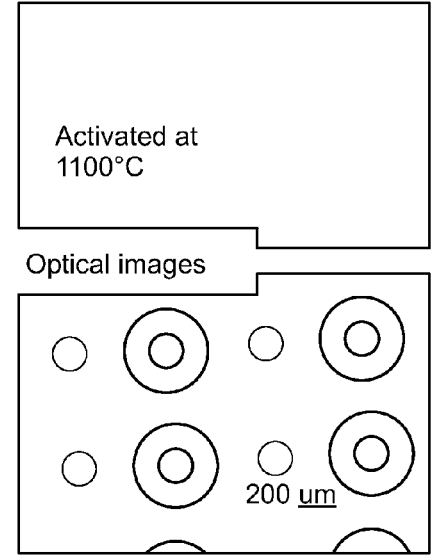
Figure 8C:
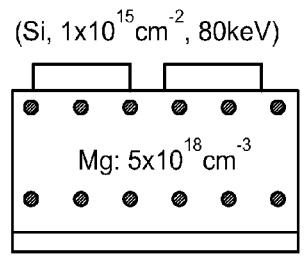
Figure 8D:
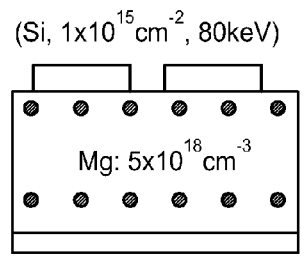

As can be appreciated by one of ordinary skill in the art, there is another issue associated with GaN:Mg, namely frequency dispersion, a phenomenon associated with all deep dopants. As discussed herein above, roughly about one percent (1%) of Mg acceptors are ionized to produce holes in a piece of neutral GaN:Mg. But, in the depletion region 16 of a p-n junction, all Mg acceptors are ionized because the Fermi level is way above the valence band edge (i.e. states below the Fermi levels are occupied by electrons). This large Mg acceptor concentration sets a small depletion width on the p-side at direct current (DC) or low frequencies, which typically is valuable because it results in a high punch-through voltage, i.e. a very high voltage is needed to deplete all the holes and ionize all the Mg acceptors. However, under high frequencies the acceptors cannot follow the fast changing voltage to change their charging states between ionized and neutral, only holes can. This implies that when calculating the device punch-through voltage, one uses the acceptor concentration at DC and low frequencies but need to use the hole concentration at very high frequencies. As illustrated in FIGS. 7A and 7B, in GaN p-n junctions, dispersion in small signal measurements of capacitance was observed at a frequency as low as 60 kHz. In particular, FIG. 7A illustrates a plot 700 of a frequency (Hz) versus capacitance (pF) for a zero-bias capacitance on various GaN p-n junctions. FIG. 7B, meanwhile illustrates a plot 710 of an ionized acceptor concentration ($cm^{-3}$) versus an early voltage $V_A$ (V) within the depleted potion of the base. In the plot 710, the collector doping is varied and assumed an applied reverse bias of 5V at the collector-base junction and a base width of 1000 angstroms (Å). The worst-case scenario estimation is presented on the right plot 710 in FIG. 7B. For a GaN n-p-n bipolar junction transistor (BJT) with a base doped at the Mg concentration of 1e19 $cm^{-3}$, the DC punch-through voltage is greater than 1000 V but at very high frequencies this punch through voltage drops to less than 100 V. Thus, to circumvent this problem associated with deep dopants the example PolarJFET 10 uses shallow dopants (or a deep dopant at low concentrations to ensure a high ionization rate). Hence, for GaN, polarization doped p-type is utilized.

Regarding the role of compensating traps formed during the polarization doping, compensating traps form in GaN no matter how one dopes it, especially in GaN with a high density. Assuming a TDD of 1e9 $cm^{-2}$ in GaN, electron holography studies have shown that there is about one charge (q) in each unit cell along the dislocation, which translates to a trap density of approximately 1e17 $cm^{-3}$ assuming TDDs behave as traps because they form deep energy levels within the bandgap. It has been found that a low level of Mg co-doping is necessary to achieve polarization induced p-doping. However, this co-doped Mg concentration is much lower than the measured hole concentration. Therefore, it is currently disclosed that Mg co-doping is necessary to suppress the formation of these compensating traps. On GaN with a TDD of less than 1e5 $cm^{-2}$, the Mg co-doping level will be decreased to a negligible value.

FIGS. 8A-8D together illustrate a conversion of a p-GaN layer into n-GaN by ion implantation. In the illustrated example, Mg doped GaN with moderate concentrations (hole concentration of approximately 2e17 $cm^{-3}$) was implanted with relatively high Si doses but shallow implantation depths. After implantation activation, ohmic contacts were successfully made to the converted n-type region showing a reasonably low contact resistance (approximately $10^{-6}$ ohm-$cm^2$). While it was recorded that the activation ratio of implanted Si approaches 100% at high doses of approximately $10^{15}$ $cm^{-2}$, corresponding peak Si concentration in GaN is greater than $10^{20}$ $cm^{-3}$, but remains low at low Si doses (e.g. less than $10^{14}$ $cm^{-2}$). This is partly due to the poor quality GaN typically used with TDD greater than $10^9$ $cm^{-2}$ and partly due to the activation method.

As documented, dislocations in GaN undergo movements under the extreme annealing conditions of approximately 1500° C. and 100 Bar, activation at approximately 1150° C. in $NH_3$ or a metalorganic chemical vapour deposition (MOCVD) reactor which is an environment similar to the epitaxial growth of GaN, which greatly suppresses the dissociation of GaN. Implanted Si in $NH_3$ environment using AlGaN/GaN HEMTs on SiC or sapphire has been successfully activated without any noticeable changes in the channel 2 DEG properties. It will be appreciated that with improved activation methods and implantation into GaN with low TDDs, activation of Si implantation can be improved. In fact, it has been demonstrated a GaN metal-semiconductor field effect transistor (MOSFET) using low dose Si implantation (e.g., Si of approximately $10^{17}$ $cm^{-3}$) may include approximately a fifty percent (50%) Si activation.

Based on these results, the present disclosure converts a polarization doped p-layer ("polarization acceptor" concentration $N_{A,pi}$ approximately $10^{17}$-$10^{18}$ $cm^{-3}$) to a n-type layer (n approximately $10^{16}$-$10^{10}$ $cm^{-3}$) using Si ion implantation (Si approximately $10^{18}$ $cm^{-3}$). While it will be appreciated that this n-region may be modified and/or optimized, this n-region is beneficial as the JFET channel a least because of the high mobility.

Figure 9A:
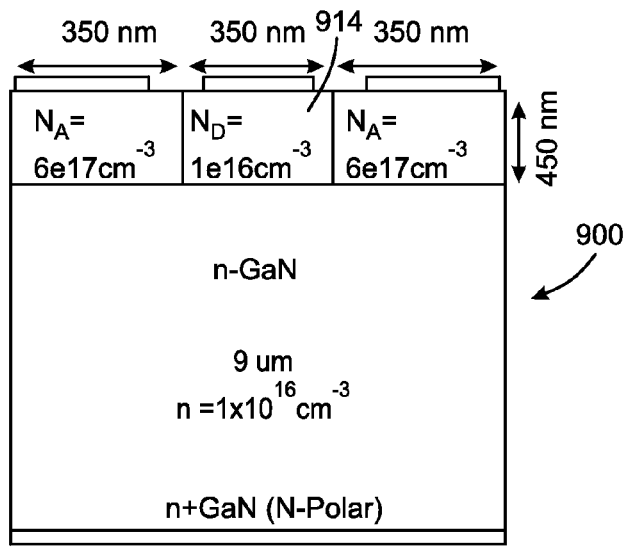
FIGS. 9A-9D together illustrate one example simulation for the example PolarJFET of FIG. 1.
Figure 9C:
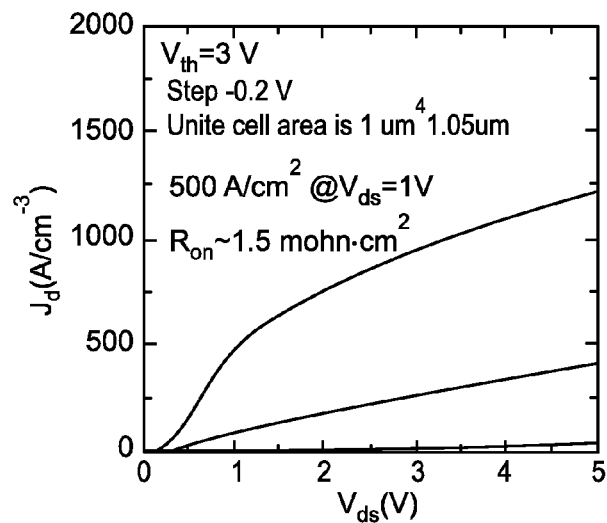
Figure 9D:
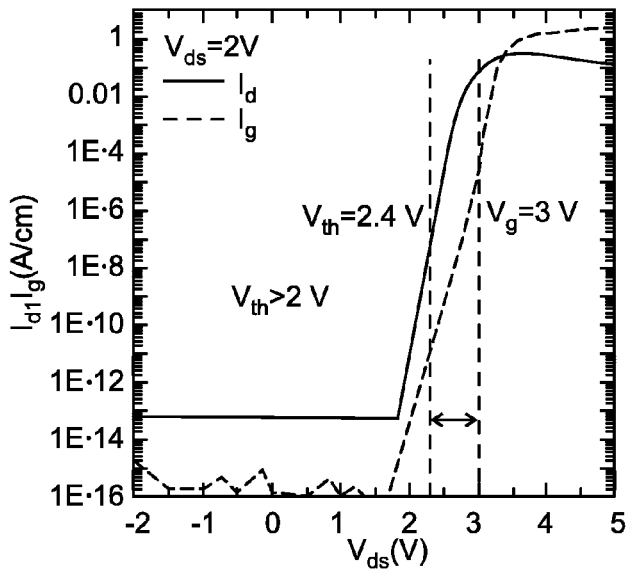
Figure 9B:
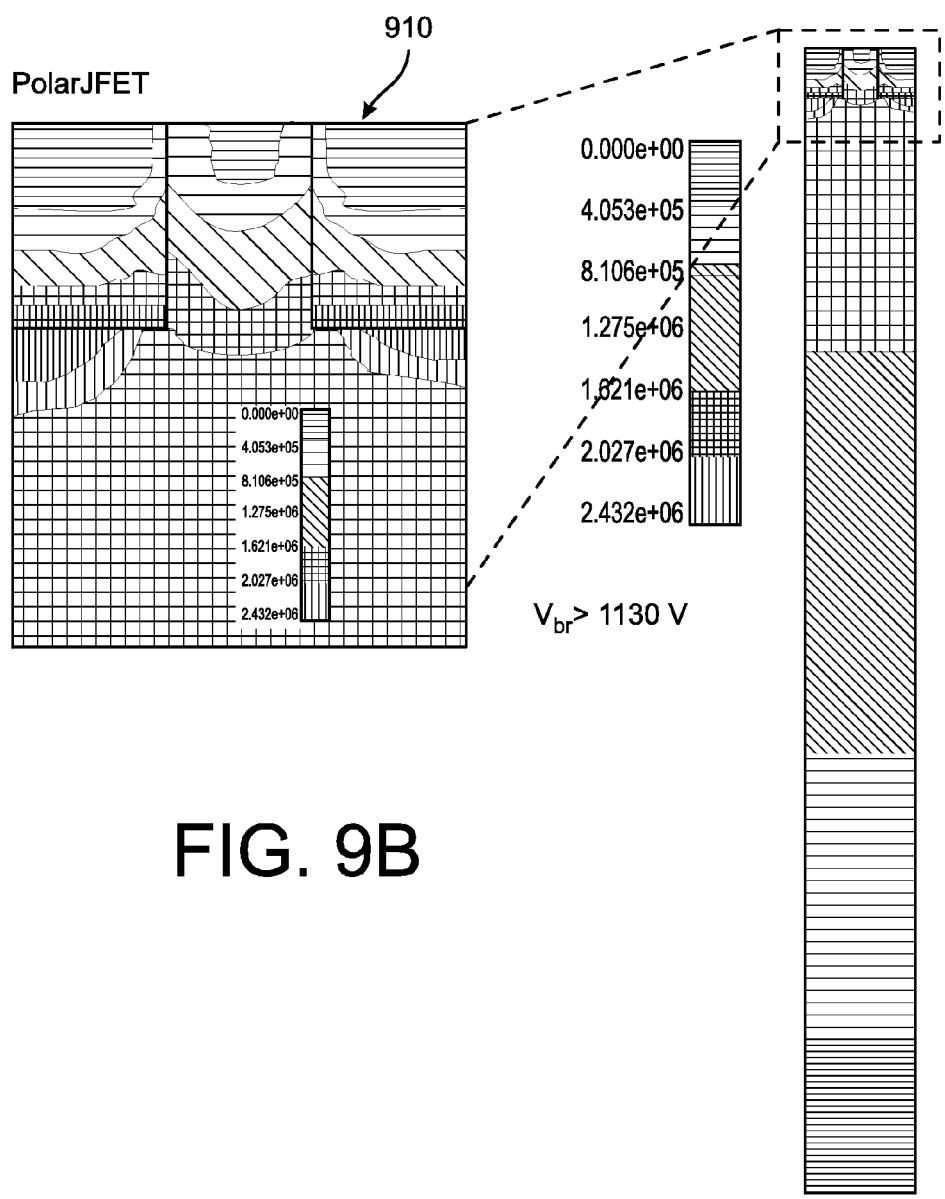

To evaluate the device current density and the breakdown voltage as a function of the device dimensions, layer structures and doping, a series of Technology Computer-Aided Design (TCAD) simulations were conducted. Specifically, shown in FIGS. 9A-9D is one example simulation for the PolarJFET 10. FIG. 9A shows the device structure 900 and FIG. 9B shows a cross section electric field profile in the off-state of the device 910. It will be understood that there is a small dimension of the channel in order to achieve a normally off device with $V_{th}$ of greater than 2V (e.g., a plot 912).

In the example shown in FIGS. 9A-9E, the channel width 914 is approximately 350 nm. While this may pose a challenge in terms of fabrication, to avoid using expensive electron beam lithography, one can use a spacer technology: first define a 1 um opening using an optical stepper lithography, then blanket deposit Plasma-enhanced chemical vapor deposition (PECVD) SiN followed with an anisotropic dry etch to shrink the opening from approximately 1 um to 0.35 um.

Figure 10A:
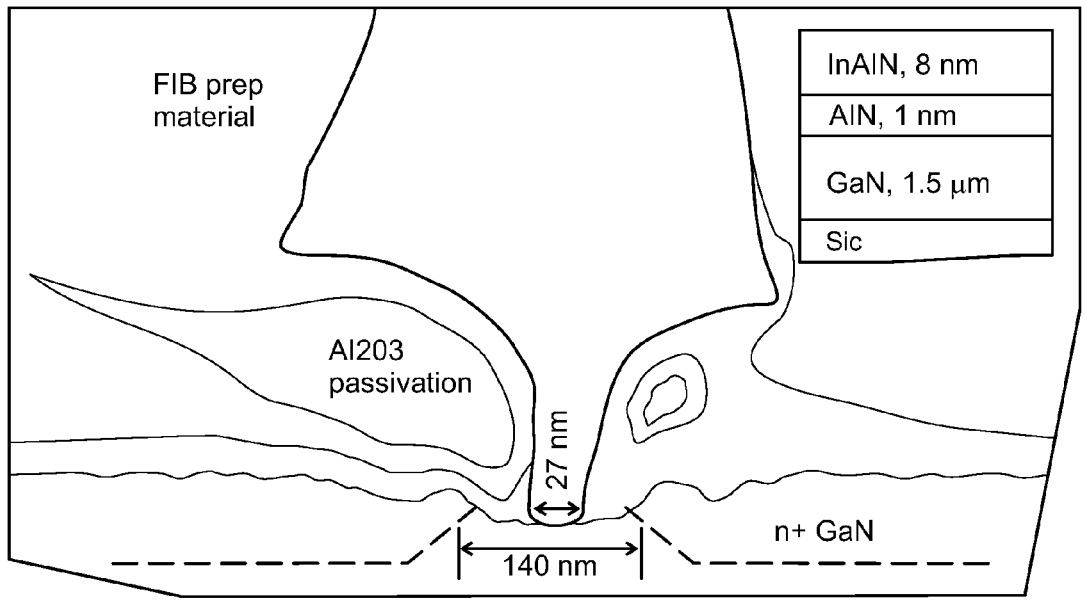
FIGS. 10A-10F depict one example of an ultra-scaled GaN High-electron-mobility transistor (HEMT) created using gate shrink technology.
Figure 10B:
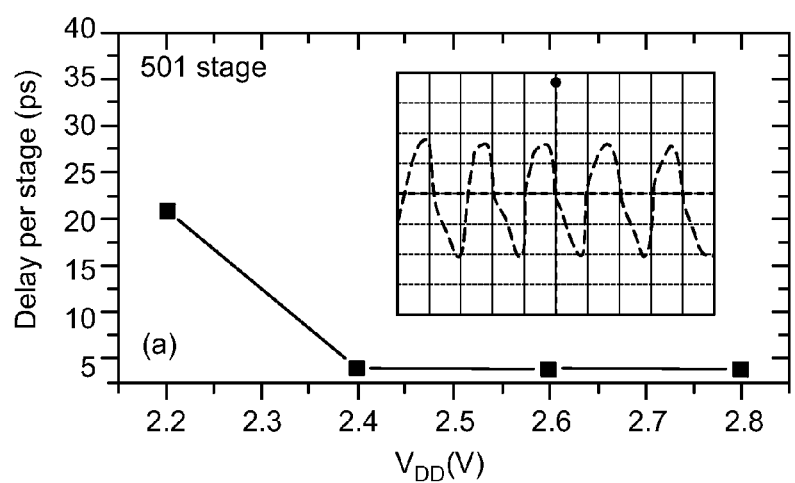
Figure 10C:
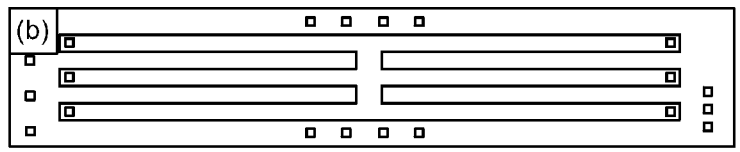
Figure 10D:
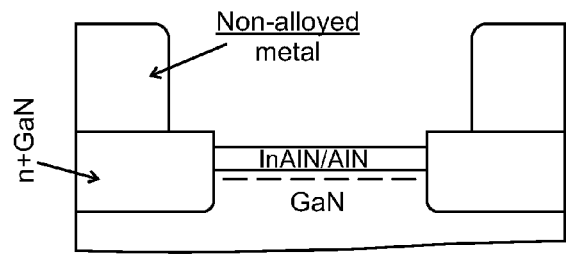
Figure 10E:
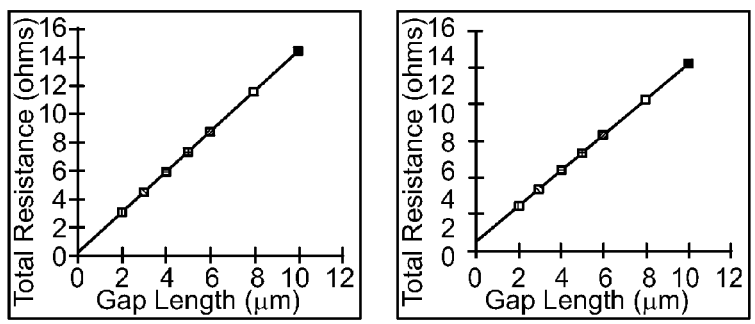
Figure 10F:
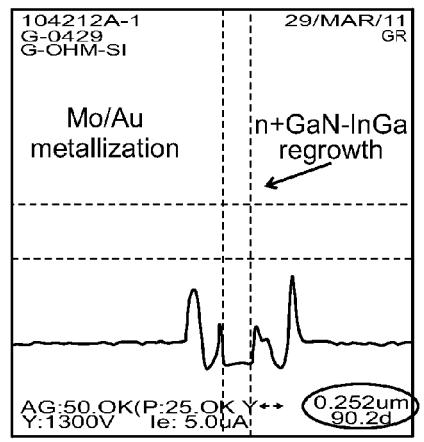

FIGS. 10A-10F, meanwhile, depict one example of an ultra-scaled GaN High-electron-mobility transistor (HEMT) created using the disclosed gate shrink technology. Specifically, FIG. 10A illustrates a monolithically integrated E/d ultra-scaled INAlN/AlN/GaN HEMTs with a Ft/Fmax of 350/400 GHz using the disclosed sidewall process to shrink the gate length down to approximately 20 nm. FIG. 10B illustrates a demonstration of the feasibility of this technology by demonstrating 501-stage ring oscillators. In addition, as illustrates in FIG. 10F, low ohmic contact resistance may be achieved by MBE regrowth of $n^+$GaN.

PolarMOS and PolarMOSH

In the voltage-control mode operation of a JFET such as the example PolarJFET 10, one needs to prevent injecting holes into the n-region. The built-in potential of the p-n junction (e.g., $V_{bi}<E_g$, the bandgap) determines the maximum gate-channel voltage that can be applied without turning on the gate diode, and consequently the widest possible conducting channel. The maximum conducting electron concentration is the net dopant concentration in the n-region ($N_D$-$N_A$). This is different from a MOSFET, because in a MOS channel the conducting carrier concentration generated by field-effect is typically much higher than the doping concentration in the channel. In a JFET, the wider the channel and the higher the electron concentration, the higher the output current. As a result, high $I_{on}$ and high $I_{on}/I_{off}$ can be easily achieved in a normally off JFET since the wide channel can be depleted under reverse gate bias. When shifting $V_{th}$ to more positive values, it is oftentimes necessary to narrow the channel and lower the channel doping concentration. In turn, this severely limits the allowed gate voltage swing to be $V_{th}$-$V_{br}$ thus limiting $I_{on}$. To overcome this issue, vertical diffused metal oxide semiconductor (VDMOS) has been widely studied in Si power devices. It is effectively a monolithic integration of a normally-off lateral MOSFET cascoded with a normally-off vertical JFET. One advantage of the cascode configuration is that the normally-off and normally-on portions of the device are decoupled and can be designed independently.

Figure 11:
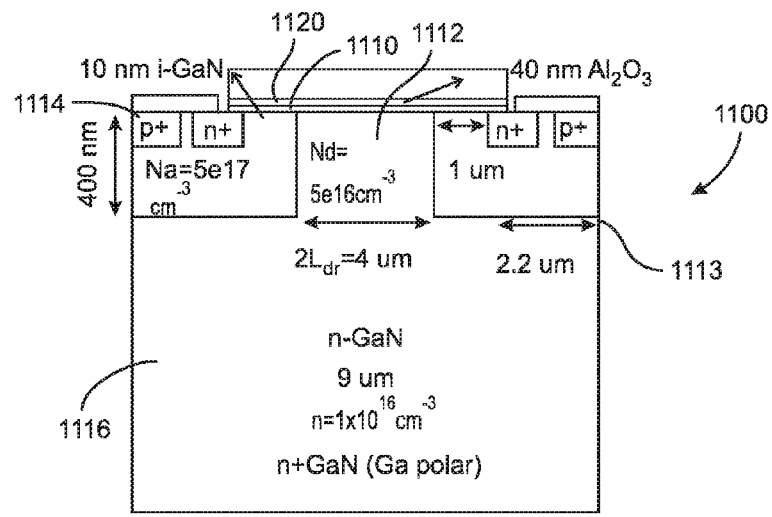
FIGS. 11 and 12 show an example of a PolarMOS 1100 developed in accordance with the teachings of the present disclosure.
Figure 12:
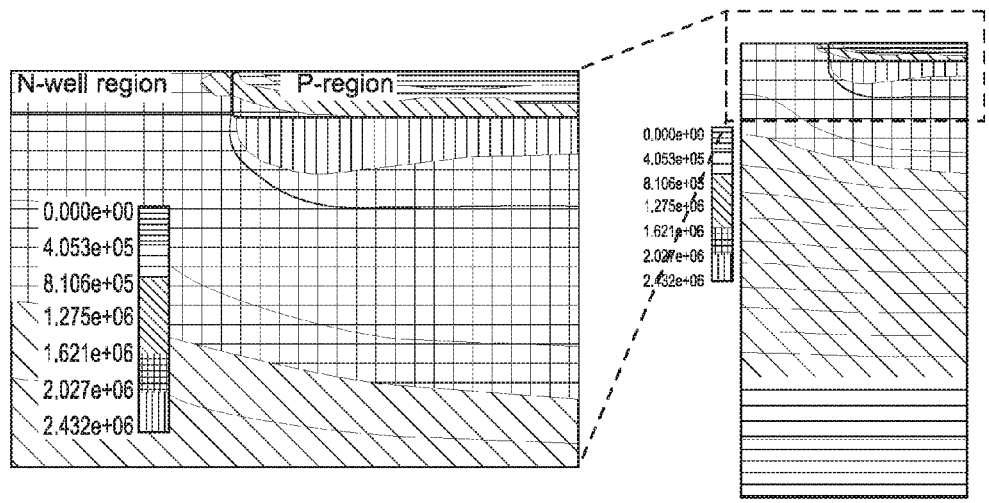
Figure 13A:
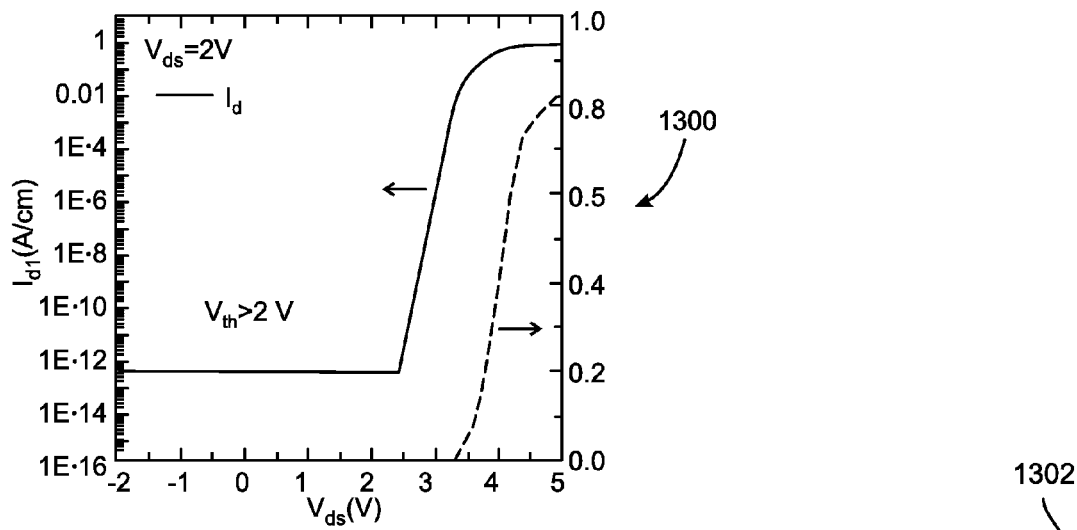
FIGS. 13A-13C illustrates various plots showing an example parametric investigation of the impact of the width of an n-drift window.
Figure 13B:
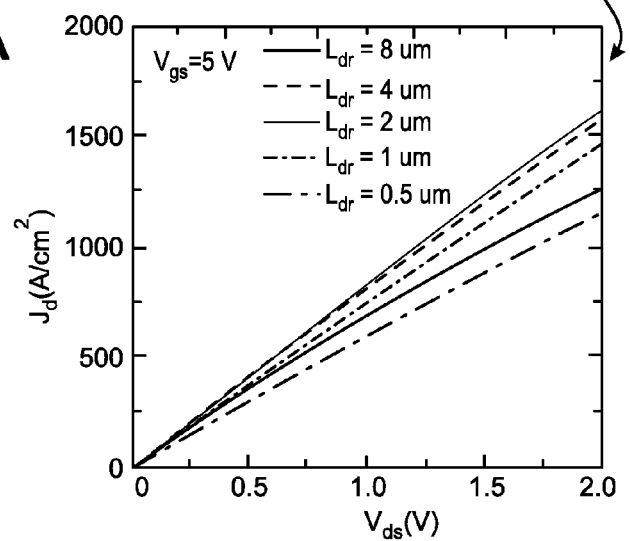
Figure 13C:
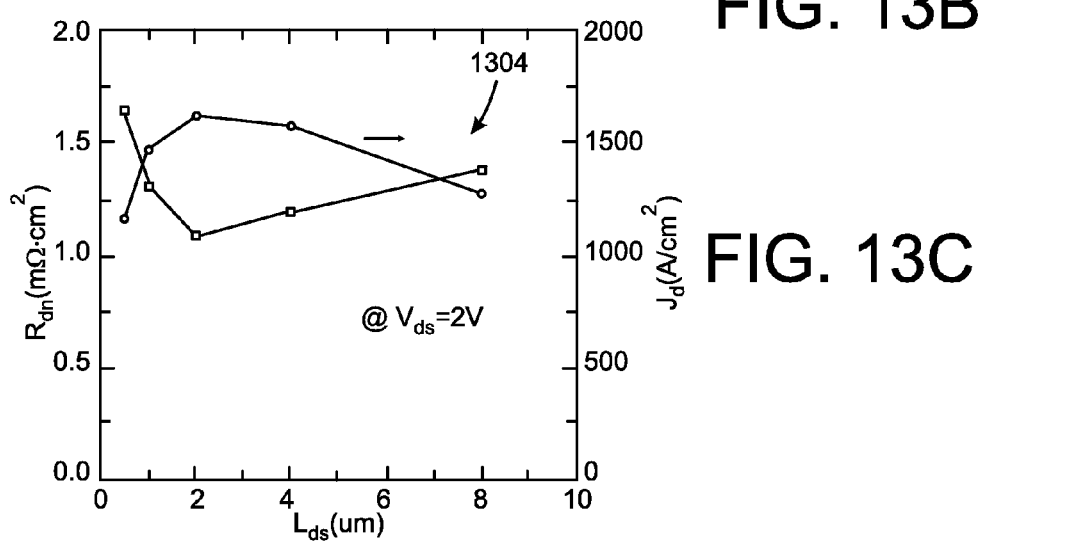

FIGS. 11, 12 show an example of a PolarMOS 1100 developed in accordance with the teachings of the present disclosure. FIGS. 13A-13C illustrates various plots 1300, 1302, and 1304 showing an example parametric investigation of the impact of the width of an n-drift window.

As illustrated in FIG. 11, the example device 1100 includes an epitaxial layer structure that is the same as the example PolarJFET 10 shown in FIG. 1, except for a thin AlGaN barrier layer 1110 is grown on top of a thin unintentionally doped GaN channel 1112 and a polarization-doped p-AlGaN layer 1114 underneath.

In this design of a normally-off portion of the Polar Metal-Oxide Semiconductor Heterostructure Field-Effect Transistor device (PolarMOS), which is also a vertical device, the layer stack from the top surface down for the example includes the gate dielectric layer 1120, which is approximately 20 nm $Al_2O_3$ and 10 nm $Al_{x<0.2}GaN$ top barrier 1110, an approximately 10 nm UID GaN channel 1113, the polarization doped p-layer 1114 by grading down from GaN to $Al_{x<0.3}GaN$ as the drift region 1116. The composite top gate dielectric layer consists of a gate oxide ($E_g$ approximately 7-10 eV, for reducing gate leakage) and an epitaxially grown low Al composition AlGaN layer 1110 ($E_g$ approximately 4 eV) for minimizing interface scattering and result in high channel carrier mobility. This technique has may achieve simultaneously $V_{th}$ greater than 2V and high channel electron mobility in AlGaN/GaN HEMTs. For instance, HRL recently reported $V_{th}$ greater than 0V and a peak mobility of greater than 1000 $cm^2/Vs$. In the present PolarMOS design 1100, because the inversion electron channel primarily resides within the UID GaN layer with an epitaxial AlGaN/GaN heterojunction, a high mobility of greater than 1000 $cm^2/V_s$ may be achieved.

The present disclosure keeps the Al composition in the polarization-doped layer to less than 30% to ensure high effectiveness in the ion implantation and activation process. Further, an added benefit of a $p-Al_{0->x}GaN/n-Al_{x->0}GaN$ junction is that the p-n junction depletion falls in the AlGaN layer, because AlGaN has a higher bandgap than GaN, its critical electrical field is generally higher than that of GaN.

While the present results indicate that p-GaN can be converted into n-GaN by ion implantation, the electron mobility in the converted region is yet to be fully characterized. There remains a possibility that this electron mobility could be low, such as for example less than 200 $cm^2/Vs$. If so, the performance of the example PolarJFET 10 may be degraded (see FIG. 14A).

Figure 14A:
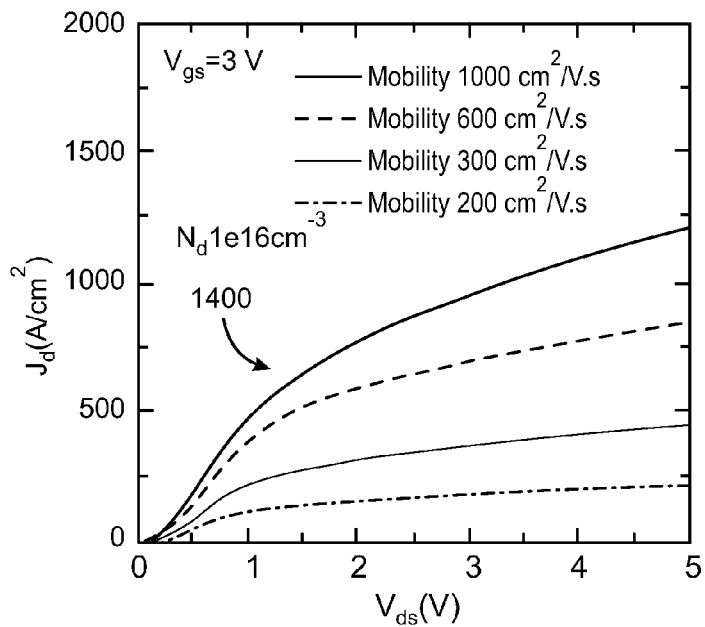
FIG. 14A illustrates an output current density dependence on the electron mobility in the converted n-region for an example PolarJFET.
Figure 14B:
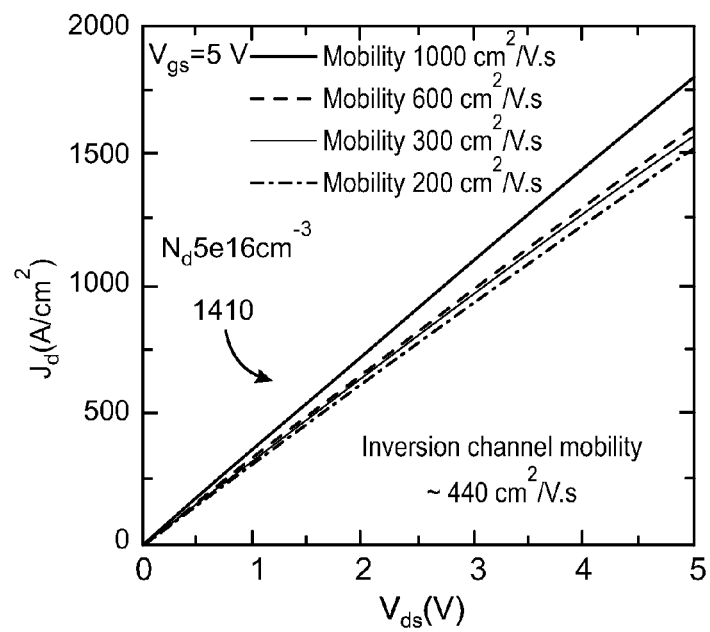
FIG. 14B illustrates an output current density dependence on the electron mobility in the converted n-region for an example PolarMOS.

On the other hand, the PolarMOS 1100 exhibits a very weak dependence on the mobility in this region (see FIG. 14B). Specifically, FIG. 14A illustrates a plot 1400 of an output currently density $J_{on}$ and $R_{on}$ dependency on the electron mobility in the converted n-region of the example PolarJFET. Meanwhile FIG. 14B illustrates a plot 1420 of an output currently density $J_{on}$ and $R_{on}$ dependency on the electron mobility in the converted n-region of the example PolarMOS. As can be seen the plot 1400 shows that the JFET demonstrates a strong dependence on the electron mobility, i.e., the lower the mobility, the lower the $J_{on}$ and the higher the $R_{on}$. In contrast, the plot 1420 demonstrates that the PolarMOS has a relatively weak dependence on the electron mobility because the output current is determined by the inversion channel properties. The converted n-region is part of the drift region of the PolarMOS and as a result, it introduces a relatively small increase in $R_{on}$ due to reduced mobility.

Figure 15A:
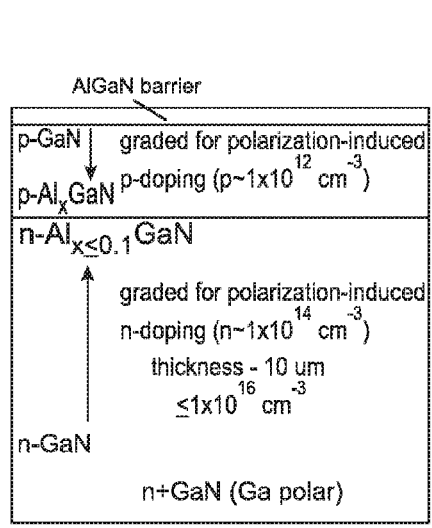
FIGS. 15A-15H together illustrate one example process of manufacturing an example PolarMOS.
Figure 15B:
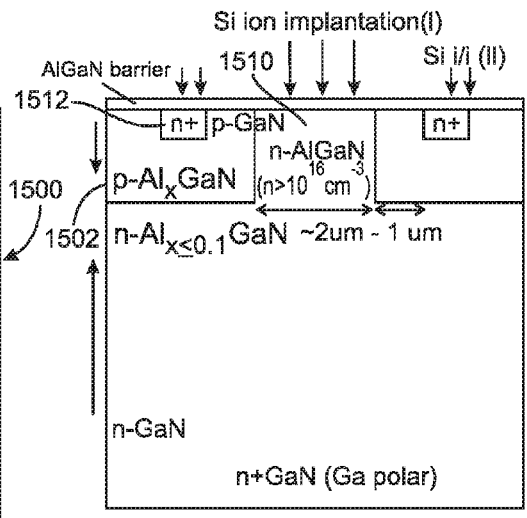
Figure 15C:
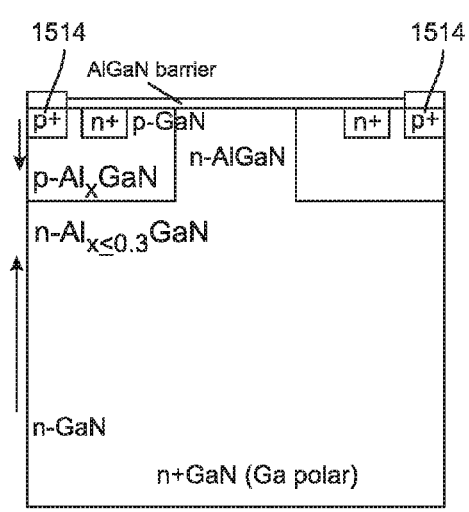

One example process of manufacturing an example PolarMOS is depicted in FIGS. 15A-15H. In FIG. 15A, a graded epitaxial structure 1500 is formed. In FIG. 15B, Si ion implantation is performed in the area of the n-AlGaN region 1510 and the n+region 1512. In FIG. 15C, Molecular beam epitaxy (MBE) regrowth of the p+GaN ohmic contacts 1514 is performed. With regard to the ohmic contact formation to a p-AlGaN back barrier 1502, because it is buried tens of nanometers below the device epi-wafer surface, in some examples, it might be challenging to form an effective ohmics contact after etching the top layers away. As such, if necessary, it may be possible to incorporate a p++GaN:Mg regrowth by MBE to improve the ohmic contact.

Figure 15D:
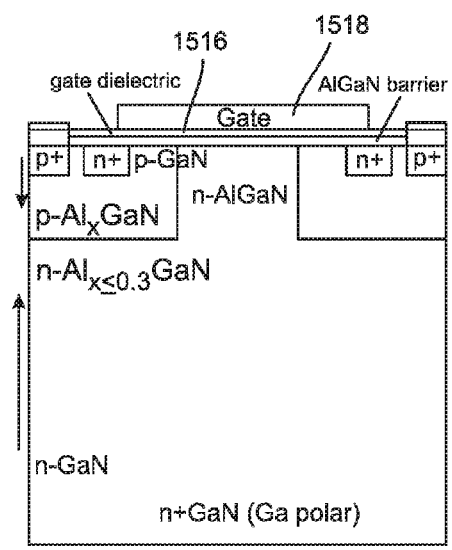
Figures 15E, 15F:
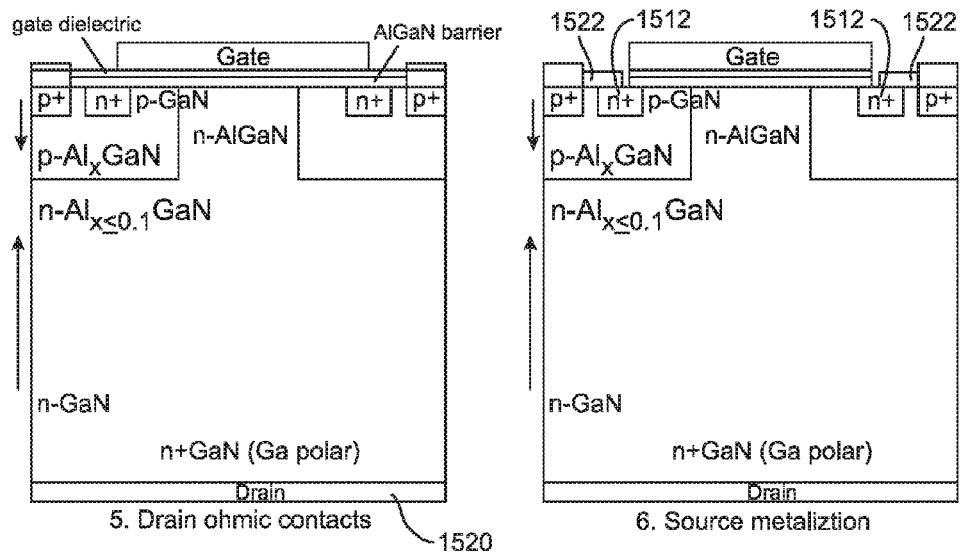
Figures 15G, 15H:
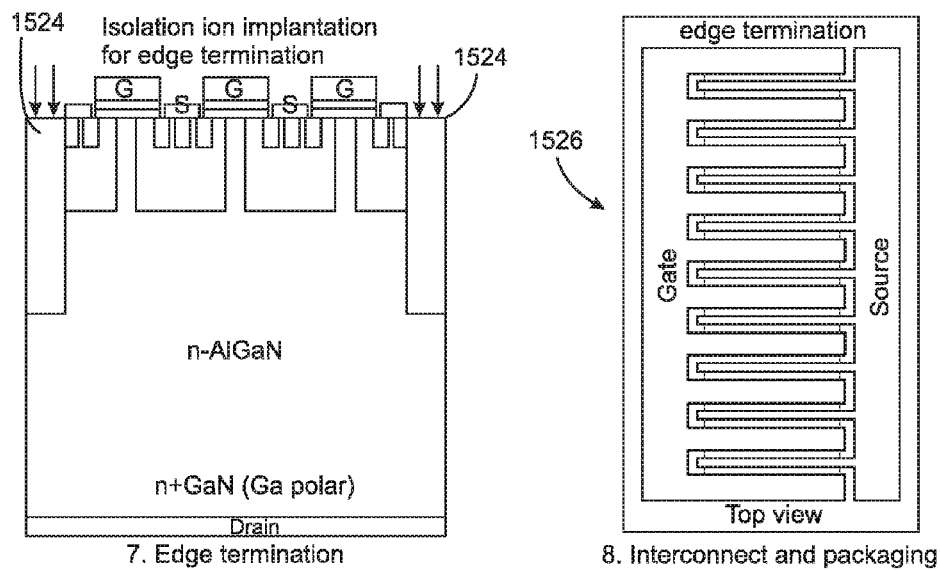

Referring to FIG. 15D, once the ohmic contacts 1514 are formed, a gate dielectric 1516 is deposited, and a gate 1518 is metalized. In FIG. 15E, a drain ohmic contact 1520 is formed. In FIG. 15F, a source 1522 is metalized on the n+regions 1512. After the source 1522 is metalized, at FIG. 15G, isolation ion implantation is performed to form edge terminations 1524. Finally, the example PolarMOSs are interconnected and packaged to form a production device 1526 at FIG. 15H.

Figure 16:
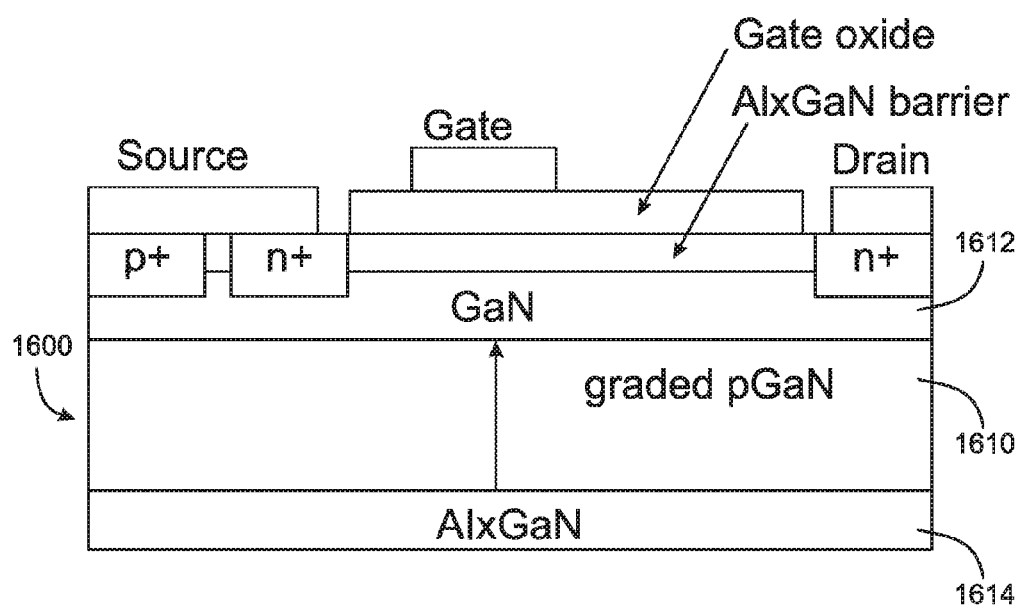
FIG. 16 illustrates an example PolarMOSHFET.

Referring to FIG. 16, an example PolarMOSHFET 1600, or PolarMOSH for short, is illustrated. The example PolarMOSHFET 1600 includes a graded and/or polarization-doped back barrier such as, for example, a pGaN layer 1610 that present a Reduced Surface Field (RESURF) effect when the device is in an off state. The example PolarMOSHFET presented a higher breakdown voltage when compared with a uGaN buffer or an AlGaN back barrier. The graded pGaN layer 1610 has a GaN layer channel 1612 on the top, providing low Al composition and low Mg doping, thus presented higher electron mobility. Finally an AlxGaN layer with appropriate gate dielectrics such as $Al_2O_3$ 1614 provides a higher breakdown field to prevent vertical breakdown on the drain side of the p-n junction. In the example PolarMOSH 1600, the back barrier 1610 is graded or polarization-doped, not the channel 1612 as in the example PolarJFET 10. In this example, the channel 1612 in the PolarMOSH 1600 is binary GaN, not graded.

It will be appreciated by one of ordinary skill in the art that of the potential risks in demonstrating the example PolarFETs, one of the possible troubling points is the crystal quality of the ion-implanted region, and especially its high field properties. It is well known that both line defects and point defects degrade the high field handling capability of the material. It is relatively easy to characterize the density of the 1-D (i.e. lines), 2-D (i.e. grain boundaries) and 3-D (i.e. voids) defects using various imaging technologies such as, for example, X-Ray Diffraction (XRD), Transmission Electron Microscopy (TEM), and/or any other suitable imaging technology. However, it is more difficult to characterize point defects and understand their impacts on the material electronic properties. For GaN, yellow luminescence (YL) has been most commonly used as a facile method to gauge the amount of point defects due to VGa, O and C incorporation etc. It is understood that the effective breakdown electric field of GaN increases with decreasing YL intensity. As such, it may be optionally beneficial to monitor the YL of all device epitaxial layers to understand their properties and optimize the ion implantation process.

In some example, regrowth of the JFET n-channel may be utilized as a risk mitigation strategy for compromised breakdown behavior in the converted region by ion implantation, such as for instance, by etching away the p-layer in the middle and regrowing the JFET n-channel region using MBE or MOCVD. Typically, the regrown n-AlGaN and p-GaN diodes exhibit very low leakage current, which is highly suitable for the present disclosure. Still further, Al-containing GaN has been known to suppress dopant migration near the regrowth interface.

Still further, as mentioned above, epitaxial liftoff may be optionally utilized for material cost reduction. Specifically, GaN substrates of 2" with TDD of approximately $10^4$ cm$^{-2}$ and 4" with TDD of approximately $10^5$ cm$^{-2}$ are commonly available today. However, they are oftentimes relatively expensive in comparison to Si. To achieve functional cost comparable to that of Si power devices, one must typically endeavor to re-use one GaN substrate as many times as possible.

To offset some of the cost of the GaN substrates, the present disclosure may optionally use a bandgap selective photoelectrochemical (PEC) etch to liftoff the epitaxial power device layer from the underlying substrate on a wafer scale. In the present example, the sacrificial layer is made of InGaN superlattices that exhibit a smaller bandgap than GaN. This technique may be utilized because it is the most widely studied wet etch method of GaN, and may be performed utilizing any suitable technology including GaN/air gap DBRs and microdisk GaN lasers etc. In this example, the liftoff device layer is transferred to a diamond-like carbon wafers (large size wafers, both thermally and electrically conducting) or other suitable substrates for further processing and packaging. The example liftoff process is performed after the ion implantation and activation, which is a high thermal budget process, to avoid challenges to subject the transferred device thin films to these steps.

Figure 17A:
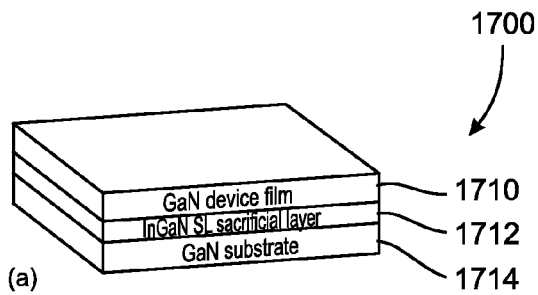
FIGS. 17A-17C illustrated an example wafer scale epitaxial liftoff process using a photoelectrochemical etch (PEC) process.
Figure 17B:
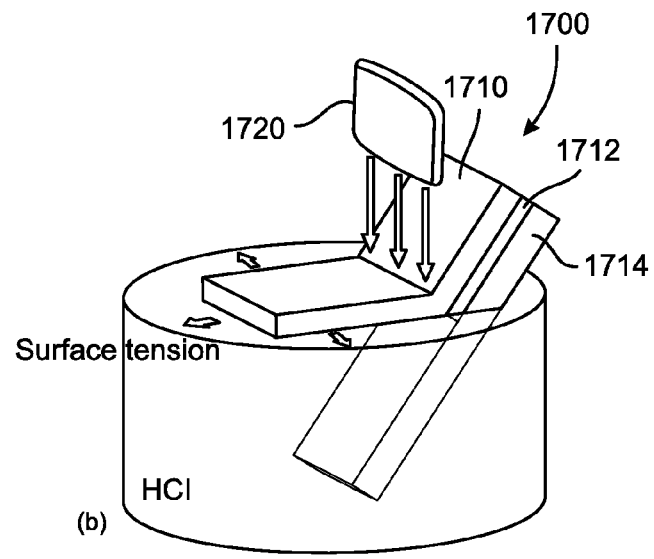
Figure 17C:
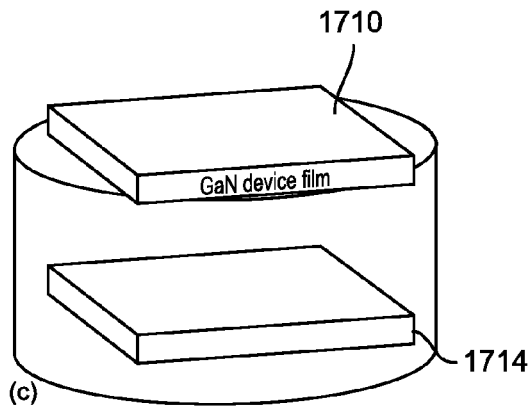

More particularly, referring to FIGS. 17A-17C, there is illustrated an example wafer scale epitaxial liftoff process using a photoelectrochemical etch (PEC) process. As illustrated in FIG. 17A, an example GaN/AlGaN power device 1700 includes a layer structure, including for instance a GaN, or other suitable material, device film 1710 grown on top of a sacrificial layer 1712, such as a InGaN superlattice, which is located on a substrate 1714, such as a GaN substrate. IN this example, the sacrificial layer 1712 has a lower bandgap than the device film 1710. As illustrated in FIG. 17B, when a source of UV light 1720 below the bandgap of the device film 1710 and above the bandgap of the sacrificial layer 1712 is illuminated onto the device 1700, electrons and holes are generated within the sacrificial layer 1712 only. The holes (e.g., broken bonds) migrate toward the surface and participate in oxidation. As such, the bonds of the sacrificial layer 1712 break and dissolve in an electrolyte. For example, when submerging the device 1700 into an electrolyte under illumination, the IN/Ga-N bonds break and the In/Ga dissolves in the electrolyte, and thus the InGaN sacrificial layer 1712 will be continuously etched. Furthermore, due to surface tension, the device film 1710, i.e., the liftoff layer, will stay on the surface of the electrolyte. Finally, as illustrated in FIG. 17C, when the sacrificial layer 1712 is completely etched, the device film later 1710 is separated from the substrate 1714, which can be reused as desired.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents.

We claim:

1. A III-V Nitride-based field effect transistor (FET) comprising:
   a compositionally graded and polarization doped p-layer underlying at least one of a source, drain, gate, or body contact;
   a compositionally graded and doped n-channel underlying at least one of the source or gate contact, wherein the n-channel is converted from the p-layer to the n-channel by ion implantation;
   a drift region underlying the doped p-layer and the n-channel;
   a n+region underlying the drift region; and
   a drain underlying the n+region.

2. A field effect transistor as defined in claim 1, wherein the n-channel is converted via ion implantation of silicon.

3. A field effect transistor as defined in claim 1 wherein the drift region is a doped n-layer.

4. A field effect transistor as defined in claim 3, wherein the drift region is a doped n-layer comprising GaN.

5. A field effect transistor as defined in claim 1, wherein the p-layer comprises AlGaN.

6. A field effect transistor as defined in claim 1, wherein the transistor forms a vertical junction field effect transistor.

7. A field effect transistor as defined in claim 1 further comprising a substrate between the buffer and the drain.

8. A field effect transistor as defined in claim 7, wherein the substrate is GaN.

9. A metal-oxide semiconductor field effect transistor (MOSFET) comprising:
   a compositionally graded AlGaN epitaxial structure;
   an n-channel formed in the upper portion of the epitaxial structure via ion implantation;
   a pair of n+regions formed in the upper portion of the epitaxial structure laterally displaced on either side of the n-channel, wherein the n+regions are formed via at least one of ion implantation or regrowth;
   a p doped region formed in the upper portion of the epitaxial structure laterally displaced on either side of the n+regions and in ohmic contact with a p layer;
   an AlGaN top barrier, a gate contact overlaying the n-channel;
   a source overlaying at least a portion of the upper portion of the epitaxial structure; and
   a drain underlying at least a portion of a lower portion of the epitaxial structure.

10. A metal-oxide semiconductor field effect transistor as defined in claim 9, wherein the n-channel is formed via ion implantation of silicon.

11. A metal-oxide semiconductor field effect transistor as defined in claim 9, wherein the n-channel comprises AlGaN.

12. A metal-oxide semiconductor field effect transistor as defined in claim 9, wherein the lower portion of the epitaxial structure comprises GaN.

13. A metal-oxide semiconductor field effect transistor as defined in claim 9, further comprising edge terminations on each side of the epitaxial structure.

14. A metal-oxide semiconductor field effect transistor as defined in claim 12, wherein the edge termination is formed via isolation ion implantation.

15. A metal-oxide semiconductor heterostructure field effect transistor comprising:
   an AlGaN compositionally graded pGaN layer;
   a GaN channel overlaying the pGaN layer;
   at least two n-doped regions formed in the upper portion of the GaN channel laterally displaced from one another;
   at least one p-doped region formed in the upper portion of the GaN channel in ohmic contact with the graded pGaN layer;
   a gate dielectric and a gate contact overlaying the GaN channel;
   a source overlaying at least a portion of one of the n-doped regions; and a drain overlaying at least a portion of the other of the n-doped region.

16. A field effect transistor as defined in claim 1, wherein the compositionally graded and doped n-channel is graded in the different direction from the p-layer.

17. A field effect transistor as defined in claim 1, wherein the compositionally graded and doped n-channel is adjacent to the p-layer.

18. A field effect transistor as defined in claim 17, where the compositional grading is equal at the juncture between the n and p layer.

19. A field effect transistor as defined in claim 1, wherein the graded and doped n-channel comprises compositionally graded AlGaN.

20. A field effect transistor as defined in claim 4, wherein the drift region is a doped n-layer further comprising linearly graded n-type AlGaN.

21. A metal-oxide semiconductor field effect transistor as defined in claim 12, wherein the lower portion of the epitaxial structure further comprises linearly composition graded doped n-type AlGaN.

* * * * *